US008791415B2

(12) United States Patent
Isozaki

(10) Patent No.: US 8,791,415 B2
(45) Date of Patent: Jul. 29, 2014

(54) ELECTRON MICROSCOPE DEVICE

(75) Inventor: Hisashi Isozaki, Tokyo-to (JP)

(73) Assignee: Horiba Ltd., Kyoto (JP)

( * ) Notice: Subject to any disclaimer, the term of this patent is extended or adjusted under 35 U.S.C. 154(b) by 204 days.

(21) Appl. No.: 12/653,366

(22) Filed: Dec. 11, 2009

(65) Prior Publication Data

US 2010/0163729 A1   Jul. 1, 2010

(30) Foreign Application Priority Data

Dec. 26, 2008   (JP) .................................. 2008-334064

(51) Int. Cl.
*G01N 23/225* (2006.01)

(52) U.S. Cl.
USPC ............................. 250/310; 250/307; 250/397

(58) Field of Classification Search
CPC ................................ G01N 23/225; H01J 37/28
USPC ........................................................ 250/310
See application file for complete search history.

(56) References Cited

U.S. PATENT DOCUMENTS

| 5,333,495 | A * | 8/1994 | Yamaguchi et al. ............ 73/105 |
| 5,399,869 | A * | 3/1995 | Usuda ........................ 250/486.1 |
| 6,031,230 | A | 2/2000 | Toumatsu |
| 6,204,918 | B1 | 3/2001 | Isozaki et al. |
| 6,373,070 | B1 | 4/2002 | Rasmussen |
| 6,407,373 | B1 | 6/2002 | Dotan |
| 7,045,791 | B2 | 5/2006 | Benas-Sayag et al. |
| 7,157,703 | B2 * | 1/2007 | Nakasuji et al. .............. 250/311 |
| 7,317,515 | B2 | 1/2008 | Buijsse et al. |
| 7,910,895 | B2 * | 3/2011 | Uchiyama et al. ............ 250/397 |
| 8,097,849 | B2 | 1/2012 | Ohtomo et al. |
| 2004/0218172 | A1 | 11/2004 | DeVerse et al. |
| 2009/0002695 | A1 * | 1/2009 | Saito et al. .................. 356/237.4 |
| 2010/0051802 | A1 | 3/2010 | Marchman et al. |
| 2010/0091362 | A1 | 4/2010 | Isozaki et al. |
| 2010/0163728 | A1 | 7/2010 | Ohtomo et al. |
| 2011/0180715 | A1 | 7/2011 | Ronda et al. |
| 2011/0315877 | A1 | 12/2011 | Isozaki et al. |
| 2012/0161000 | A1 | 6/2012 | Tateno |

FOREIGN PATENT DOCUMENTS

| JP | 1-122555 A | 5/1989 |
| JP | 1-149354 A | 6/1989 |
| JP | 04-280053 | 10/1992 |

(Continued)

OTHER PUBLICATIONS

Notice of Allowance mailed Oct. 3, 2011 in co-pending U.S. Appl. No. 12/653,324.

(Continued)

*Primary Examiner* — Phillip A Johnston
(74) *Attorney, Agent, or Firm* — Nields, Lemack & Frame, LLC

(57) ABSTRACT

The present invention provides an electron microscope device, comprising a scanning electron microscope 2 provided with scanning means 10 for scanning an electron beam and an electron detector 12 for detecting an electron 11 issued from a specimen 8 where the electron beam is projected for scanning, wherein a scanning electron image is acquired based on a detection result from the electron detector, wherein the electron detector comprises a fluorescent substance layer for performing photoelectric conversion, a wavelength filter giving restriction so that all or almost all of wavelength ranges of fluorescent lights from the fluorescent substance layer can be transmitted, and a wavelength detecting element for receiving the fluorescent light transmitted through the wavelength filter and for performing photoelectric conversion.

6 Claims, 4 Drawing Sheets

(56) References Cited

FOREIGN PATENT DOCUMENTS

| | | | | |
|---|---|---|---|---|
| JP | 04280053 A | * | 10/1992 | .............. H01J 37/28 |
| JP | 04280053 A | * | 10/1992 | .................... 250/311 |
| JP | 11-108864 A | | 4/1999 | |
| JP | 2008-305905 A | | 12/2008 | |
| JP | 2010-157392 A | | 7/2010 | |

OTHER PUBLICATIONS

Office Action mailed Nov. 16, 2012 in co-pending U.S. Appl. No. 13/165,046.

Final Rejection mailed Jun. 14, 2013 in co-pending U.S. Appl. No. 13/165,046.

Notice of Allowance mailed Jan. 15, 2014 in co-pending U.S. Appl. No. 13/165,046.

* cited by examiner

ELECTRON MICROSCOPE DEVICE

BACKGROUND OF THE INVENTION

The present invention relates to an electron microscope device, by which it is possible to observe a scanning electron image and an optical image of a specimen. In particular, the present invention relates to an electron microscope device, by which an optical image can be observed at the same time during electron scanning operation.

A scanning electron microscope (SEM) is so designed that an electron beam is projected for scanning over a specimen, and the electron issued by the projection of the electron beam is detected. Then, a scanning electron image is acquired on detailed status of a surface of the specimen.

On the other hand, a field angle of the electron beam is very small, and it is very difficult to project the electron beam to a specific position unless a projecting position is identified and recognized in advance.

For this reason, an electron microscope device is provided with an optical microscope, which has magnification lower than magnification of the electron microscope. First, an illumination light (white light) is projected to the specimen, and the specimen is observed by means of the optical microscope, and a projected position is specified. Then, by changing over to the electron microscope, the electron beam is projected to scan over the projected position of the specimen and the specimen is observed.

In case it is wanted to obtain a scanning electron image, electrons emitted from the specimen enter to a fluorescent substance. A light emitted from the fluorescent substance is converted to an electric signal by a photoelectric conversion element, and a scanning electron image is acquired based on this electric signal. In case an optical image is acquired by using an optical microscope, a light reflected from the specimen is received by a photoelectric element for the optical microscope and the detection result is converted to an electric signal, and an optical image is acquired based on this electric signal.

However, a level of energy is extremely different between electrons acquired by scanning of the electron beam and a light reflected from the specimen. When a reflection light from the specimen enters the photoelectric element, which is detecting the electron beam, the photoelectric element is saturated or S/N is extremely low, and the electron beam cannot be detected.

Therefore, it has been practiced in the past that the optical microscope and the electron microscope are changed properly between a case where the optical microscope is used for observation and a case where the electron microscope is used, and it is so arranged that the electron microscope is not used for observation when it is observed by the optical microscope and that the optical microscope is not used for observation of the specimen when it is observed by electron microscope.

For instance, the optical microscope and the electron microscope are separated from each other, and an optical axis of the optical microscope and an optical axis of the electron microscope are set in a known specific relationship. When a table on which the specimen is placed is moved between the optical microscope and the electron microscope, a position to observe an optical image is associated with a position to observe a scanning electron image.

Therefore, there arises a problem in a conventional type electron microscope that the structure is very complicated and the scanning electron image and the optical image cannot be observed at the same time.

An electron microscope, by which the scanning electron image and the optical image can be observed at the same time, is disclosed in JP-A-4-280053.

In the electron microscope described in JP-A-4-280053, an optical system of the electron microscope and an optical system of the optical microscope have the same optical axis. An illumination light and an electron beam are projected at the same time. In the signals from the electron detector, signals of the illumination light are removed as DC components, and signals containing only electrons are extracted.

However, the DC components of the illumination light are extremely in higher amount compared with signal components, and it is very difficult to attain the purpose.

SUMMARY OF THE INVENTION

It is an object of the present invention to provide an electron microscope device, by which it is possible to observe a scanning electron image and an optical image at the same time, to perform observation of the scanning electron image and also to perform other observation and operation. The invention also relates to an electron microscope device, which can be designed and produced with simplified construction.

To attain the above object, the present invention provides an electron microscope device, comprising a scanning electron microscope provided with scanning means for scanning an electron beam and an electron detector for detecting an electron issued from a specimen where the electron beam is projected for scanning, wherein a scanning electron image is acquired based on a detection result from the electron detector, wherein the electron detector comprises a fluorescent substance layer for performing photoelectric conversion, a wavelength filter giving restriction so that all or almost all of wavelength ranges of fluorescent lights from the fluorescent substance layer can be transmitted, and a wavelength detecting element for receiving the fluorescent light transmitted through the wavelength filter and for performing photoelectric conversion.

Also, the present invention provides the electron microscope device as described above, further comprising an optical microscope for projecting an illumination light to the specimen, for receiving a reflection light from the specimen, and for acquiring an optical image, wherein the illumination light is designed to have a wavelength deviated from a transmission wavelength range of the wavelength filter.

Also, the present invention provides the electron microscope device as described above, further comprising a foreign object detecting device for projecting an inspection light to a surface of the specimen and for detecting a foreign object by detecting a scattered light from the foreign object, wherein the inspection light is designed to have a wavelength deviated from the transmission wavelength range of the wavelength filter.

Further, the present invention provides an electron microscope device, further comprising an interferometer for projecting an interference light to the surface of the specimen and for detecting a position in height direction of the specimen by using a reflection of the interference light from the surface of the specimen, wherein the interference light is designed to have a wavelength deviated from the transmission wavelength range of the wavelength filter.

The invention provides an electron microscope device, further comprising an optical microscope for projecting an illumination light to the specimen and for acquiring an optical image by receiving a reflection light from the specimen, a foreign object detecting device for projecting an inspection light to the surface of the specimen and for detecting a foreign object by detecting a scattered light from the foreign object, and an interferometer for projecting an interference light to the surface of the specimen and for detecting a position in height direction of the specimen by using the reflection of the interference light from the surface of the specimen, wherein the illumination light, the inspection light, and the interference light have wavelengths deviated from the transmission wavelength range of the wavelength filter, and wherein the illumination light, the inspection light, and the interference light are designed to have wavelength bands different from each other.

Also, the present invention provides an electron microscope device, wherein the illumination light is a white light, and a wavelength filter for allowing a light of wavelength range deviated from the transmission wavelength range of the wavelength filter to transmit is removably provided on an optical path of the illumination light, and when the scanning electron image is observed by the scanning electron microscope, the wavelength filter is inserted, and observation of an optical image can also be carried out at the same time, and when the scanning electron image is not observed, the wavelength filter is removed, and the optical image can be observed separately from the observation of the scanning electron image.

Also, the present invention provides an electron microscope device, wherein the wavelength filter is removably mounted, and the wavelength filter is restricted so that all or almost all lights wavelength ranges of the fluorescent lights from the fluorescent substance layer can be transmitted.

The present invention provides an electron microscope device, comprising a scanning electron microscope provided with scanning means for scanning an electron beam and an electron detector for detecting an electron issued from a specimen where the electron beam is projected for scanning, wherein a scanning electron image is acquired based on a detection result from the electron detector, wherein the electron detector comprises a fluorescent substance layer for performing photoelectric conversion, a wavelength filter giving restriction so that all or almost all of wavelength ranges of fluorescent lights from the fluorescent substance layer can be transmitted, and a wavelength detecting element for receiving the fluorescent light transmitted through the wavelength filter and for performing photoelectric conversion. As a result, it is possible to acquire the scanning electron image effectively based on a signal from the electron detector.

Also, the present invention provides an electron microscope device, further comprising an optical microscope for projecting an illumination light to the specimen, for receiving a reflection light from the specimen, and for acquiring an optical image, wherein the illumination light is designed to have a wavelength deviated from a transmission wavelength range of the wavelength filter. As a result, there is no influence from the illumination light on the observation of the scanning electron image. The scanning electron image and the optical image can be observed at the same time, and there is no need to mechanically separate the acquisition of the scanning electron image by the scanning electron microscope from the acquisition of the optical image by the optical microscope, and it is possible to design and produce the device with simplified construction.

Also, the present invention provides an electron microscope device, further comprising a foreign object detecting device for projecting an inspection light to a surface of the specimen and for detecting a foreign object by detecting a scattered light from the foreign object, wherein the inspection light is designed to have a wavelength deviated from the transmission wavelength range of the wavelength filter. As a result, the inspection light exerts no adverse influence on the observation of the scanning electron microscope, and the observation of the scanning electron image can be carried out at the same time with the detection and the observation of the foreign object. Further, there is no need to mechanically separate the acquisition of the scanning electron image by the scanning electron microscope from the detection of foreign object by the foreign object detecting device, and it is possible to design and produce the device with simplified construction.

Further, the present invention provides an electron microscope device, further comprising an interferometer for projecting an interference light to the surface of the specimen and for detecting a position in height direction of the specimen by using a reflection of the interference light from the surface of the specimen, wherein the interference light is designed to have a wavelength deviated from the transmission wavelength range of the wavelength filter. As a result, the interference light exerts no adverse influence on the observation of the scanning electron image, and the observation of the scanning electron image and the measurement of a height of the specimen can be carried out at the same time. Also, there is no need to mechanically separate the acquisition of the scanning electron image by the scanning electron microscope from the measurement of the height of the specimen by interferometer, and it is possible to design and produce the device with simplified construction.

Also, the present invention provides an electron microscope device, further comprising an optical microscope for projecting an illumination light to the specimen and for acquiring an optical image by receiving a reflection light from the specimen, a foreign object detecting device for projecting an inspection light to the surface of the specimen and for detecting a foreign object by detecting a scattered light from the foreign object, and an interferometer for projecting an interference light to the surface of the specimen and for detecting a position in height direction of the specimen by using the reflection of the interference light from the surface of the specimen, wherein the illumination light, the inspection light, and the interference light have wavelengths deviated from the transmission wavelength range of the wavelength filter, and wherein the illumination light, the inspection light, and the interference light are designed to have wavelength bands different from each other. As a result, the illumination light, the inspection light, and the interference light give no adverse influence on the observation of the scanning electron microscope. The observation of the scanning electron image, the observation of the optical image, the detection of foreign object, the observation of the foreign object, and measurement of a height of the specimen can be carried out at the same time. Further, there is no need to mechanically separate the acquisition of the scanning electron image by the scanning electron microscope from the acquisition of optical image by the optical microscope, or from the detection of foreign object by the foreign object detecting device, or from the measurement of a height of the specimen by interferometer, and it is possible to design and produce the device with simplified construction.

Also, the present invention provides an electron microscope device, wherein the illumination light is a white light, and a wavelength filter for allowing a light of wavelength range deviated from the transmission wavelength range of the wavelength filter to transmit is removably provided on an optical path of the illumination light, and when the scanning electron image is observed by the scanning electron microscope, the wavelength filter is inserted, and observation of an optical image can also be carried out at the same time, and when the scanning electron image is not observed, the wavelength filter is removed, and the optical image can be observed separately from the observation of the scanning electron image. As a result, it is possible to acquire a full-color optical image of the specimen.

Also, the present invention provides an electron microscope device, wherein the wavelength filter is removably mounted, and the wavelength filter is restricted so that all or almost all lights wavelength ranges of the fluorescent lights from the fluorescent substance layer can be transmitted. As a result, when simultaneous operation of the observation by optical microscope and the observation by the electron microscope are not required, the electron microscope device can be used while the illumination light is turned off, and it is possible to perform the observations with higher sensitivity.

DETAILED DESCRIPTION OF THE PREFERRED EMBODIMENT

Description will be given below on the best aspect for carrying out the present invention by referring to the attached drawings.

Figure 1:
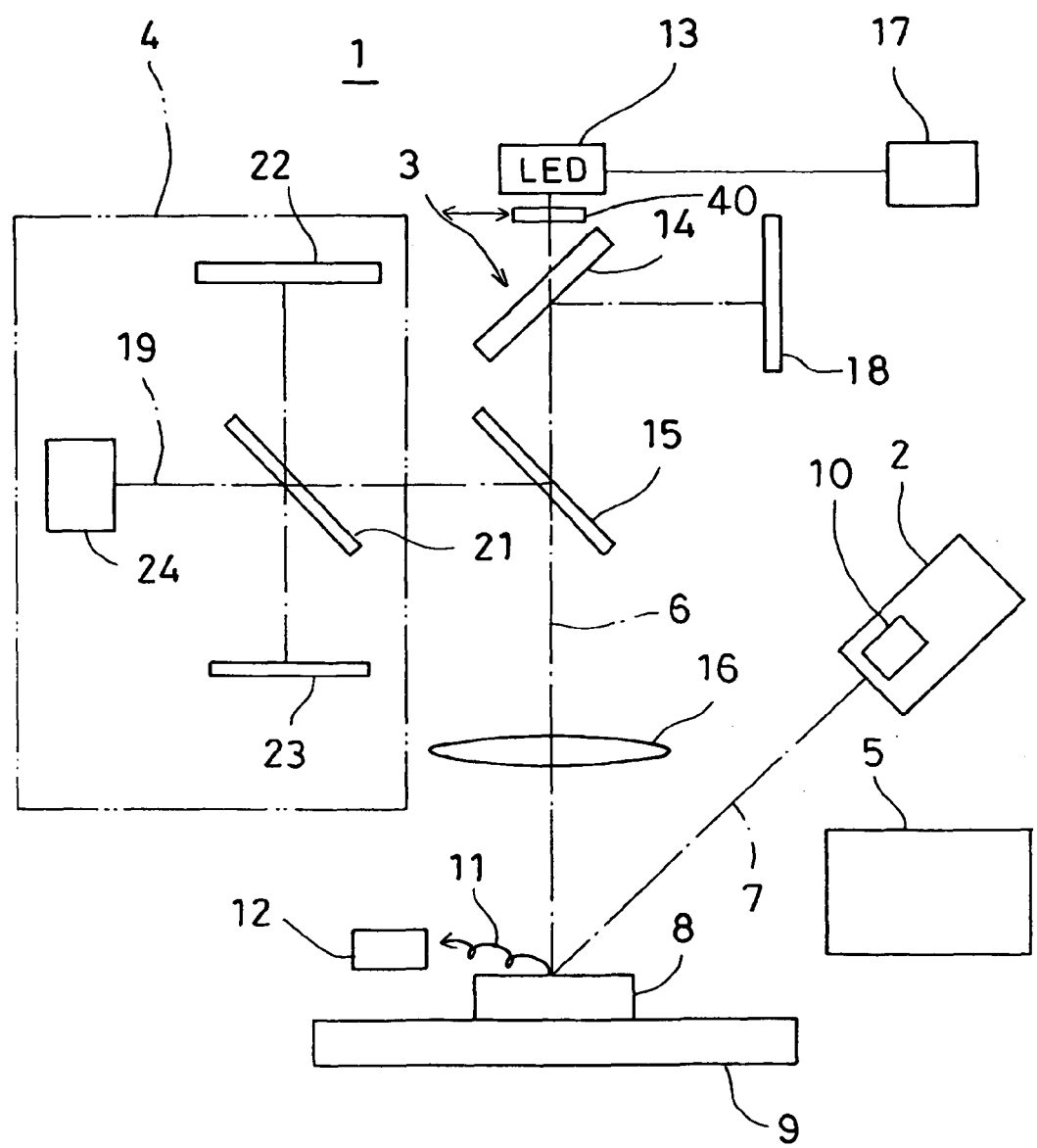
FIG. 1 is a schematical drawing to show approximate arrangement of an electron microscope device, to which the present invention is applied.
Figure 2:
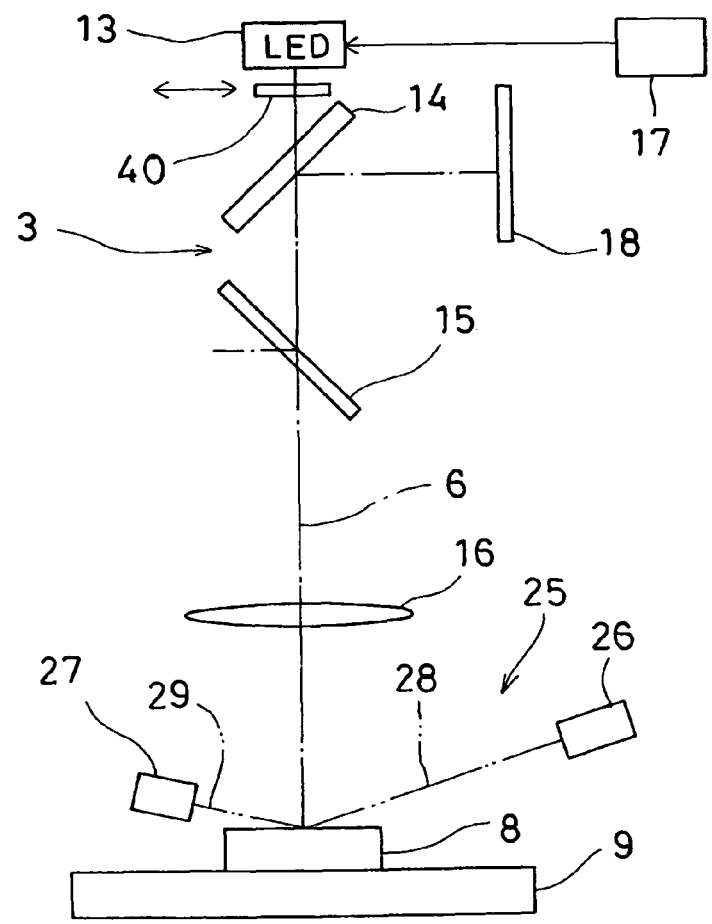
FIG. 2 is a schematical drawing to show approximate arrangement of the electron microscope device as seen from another direction.

First, referring to FIG. 1 and FIG. 2, description will be given on general features of an electron microscope device 1 according to the present invention.

The electron microscope device 1 comprises a scanning electron microscope 2, an optical microscope 3, an interferometer 4, and a control unit 5 for controlling operation of the scanning electron microscope 2, the optical microscope 3, and the interferometer 4. An object to be measured (specimen) 8 is placed at a point where an optical axis 6 of the optical microscope 3 crosses an optical axis 7 of the scanning electron microscope 2, and the object to be measured 8 is placed on an inspection stage 9, which is movable along two directions of X-Y to perpendicularly cross the optical axis 6.

The optical axis 7 of the scanning electron microscope 2 is tilted at a predetermined angle (e.g. 60°) to the optical axis 6 of the optical microscope 3, and a point where the optical axis 6 and the optical axis 7 cross each other is a point where the object to be measured 8 is observed. An electron beam is projected to the object to be measured 8 along the optical axis 7, and the electron beam is projected for scanning over a predetermined range by an electron beam scanning means 10. By the electron beam being projected for scanning, an electron 11 emitted from the object to be measured 8 is detected by an electron detector 12. The inspection stage 9 is moved in two directions of X-Y in synchronization with the projection of the electron beam, and the electron beam scans over the predetermined range of the object to be measured 8.

The result of detection by the electron detector 12 is sent to the control unit 5. Based on the result of detection, a scanning electron image is prepared at the control unit 5.

Along the optical axis 6, there are arranged an LED 13 for emitting an illumination light (white light), a first half-mirror 14, a second half-mirror 15, and an objective lens 16. Further, a wavelength filter 40 (to be described later) is removably attached on the optical axis 6 between the LED 13 and the first half-mirror 14.

The emission of the light of the LED 13 is controlled by a light emission drive unit 17. An illumination light emitted from the LED 13 passes through the first half-mirror 14, the second half-mirror 15 and the objective lens 16, and is projected toward the object to be measured 8. After being reflected by the object to be measured 8, the illumination light passes through the second half-mirror 15 and is reflected by the first half-mirror 14 and is received by a CCD for observation 18.

The interferometer 4 has an optical axis 19. The optical axis 19 is deflected by the second half-mirror 15 and reaches the object to be measured 8. Along the optical axis 19, a third half-mirror 21 is disposed. The third half-mirror 21 is disposed between a CCD for measurement 22 and a reference mirror 23. The CCD for measurement 22 is disposed on one side of the third half-mirror 21 and the reference mirror 23 is disposed on the other side of the third half-mirror 21.

From the light source for measurement 24, a single wavelength light for interference is projected along the optical axis 19. A part of the single wavelength light passes through the third half-mirror 21 and then is reflected by the second half-mirror 15 and is projected toward the object to be measured 8 via the objective lens 16. After being reflected by the object to be measured 8, the single wavelength light passes through the second half-mirror 15 and the third half-mirror 21 and is received by the CCD for measurement 22. The remaining part of the single wavelength light reflected by the third half-mirror 21 is further reflected by the reference mirror 23 and then, after passing through the third half-mirror 21 and is received by the CCD for measurement 22. The CCD for measurement 22 receives the reflection light from the object to be measured 8 and the reflection light from the reference mirror 23, and a position in height direction of the object to be measured 8 is determined according to interference of these two reflection lights.

Then, a three-dimensional position of the observation point is acquired from X-Y position of the observation point of the object to be measured 8 and from a position in height direction as acquired by the interferometer 4.

A foreign object detecting device 25 is provided for detecting a foreign object on a surface of the object to be measured 8.

The foreign object detecting device 25 has a light source 26 for foreign object detection for projecting a inspection light to detect a foreign object and a scattered light detector 27 for detecting a scattered light reflected by the foreign object. An optical axis 28 of a projection light from the light source 26 for detecting foreign object detection enters the surface of the object to be measured 8 from a direction different from an optical axis 7 of the scanning electron microscope 2. An optical axis 29 of the scattered light detector 27 is so designed that it is extended in a direction perpendicular to paper surface of FIG. 2 so that the scattered light can be easily received. Specifically, a plane, which includes the projection light optical axis 28 and the optical axis 6, perpendicularly crosses a plane, which includes the optical axis 29 and the optical axis 6. To facilitate explanation, FIG. 2 shows that the projection light optical axis 28 and the optical axis 29 are on the same plane.

An inspection light is projected to the surface of the object to be measured 8. If there is a foreign object on the surface of the object to be measured 8, the inspection light is scattered by the foreign object, and the scattered light is detected by the scattered light detector 27. The size of a detectable foreign object differs according to the wavelength of the inspection light used. When a light in kind of red color is used, a foreign object of sub-micron size can be detected, which is difficult to be observed by the optical microscope 3. Further, the field angle of the inspection light is larger than the field angle of the electron beam, and it is much easier to specify a projecting position of the inspection light and to search the objective inspection point compared with the case where the electron beam is used.

Figure 3:
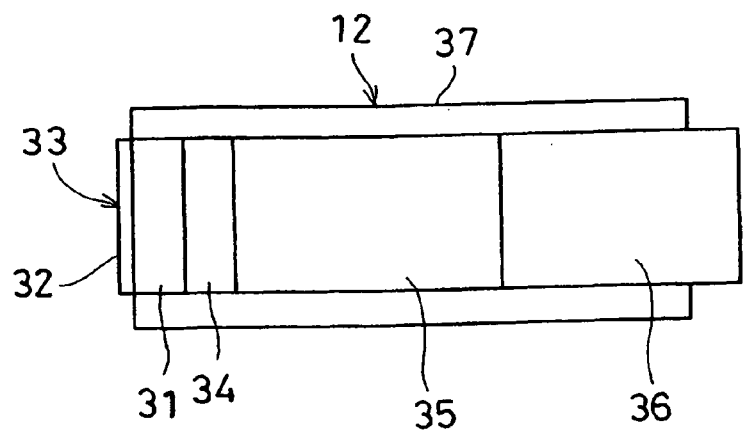
FIG. 3 is a drawing to explain an example of an electron detector used in the electron microscope device.

Next, referring to FIG. 3, description will be given on the electron detector 12.

A fluorescent substance layer 32 is formed on a transparent plate 31 such as a glass plate, and an electron-light conversion member (scintillator) 33 is prepared. On the electron-light conversion member 33, a wavelength filter 34, a light guide 35, and a wavelength detecting element 36 are arranged one after another. Further, the transparent plate 31, the fluorescent substance layer 32, the electron-light conversion member 33, the wavelength filter 34, the light guide 35 and the wavelength detecting element 36 are covered by a light-shielding cover 37 and are integrated to make up together the electron detector 12.

When an electron 11 enters the fluorescent substance layer 32, the fluorescent substance layer 32 emits a light (a fluorescent light) with a wavelength in a predetermined range. The fluorescent light passes through the wavelength filter 34 and further, reaches the wavelength detecting element 36 via the light guide 35. The wavelength detecting element 36 converts the fluorescent light to an electric signal. Accordingly, the electron detector 12 performs the conversion "electron-light-electricity". When the electron 11 enters, an electric signal is issued.

In the present embodiment, various types of light, i.e. the light detected by the detector 12 through conversion of the electron 11, the illumination light projected by the LED 13, the single wavelength light projected from the light source for measurement 24, and the inspection light projected from the light source for detecting foreign object 26 have different wavelength bands, respectively. These lights are separated from each other by wavelengths, and these can be detected by selecting the separated wavelengths, and the observation can be performed at the same time in a plurality of optical systems.

Now, referring to FIG. 4 and FIG. 5, description will be given further on the electron detector 12.

Figure 4A:
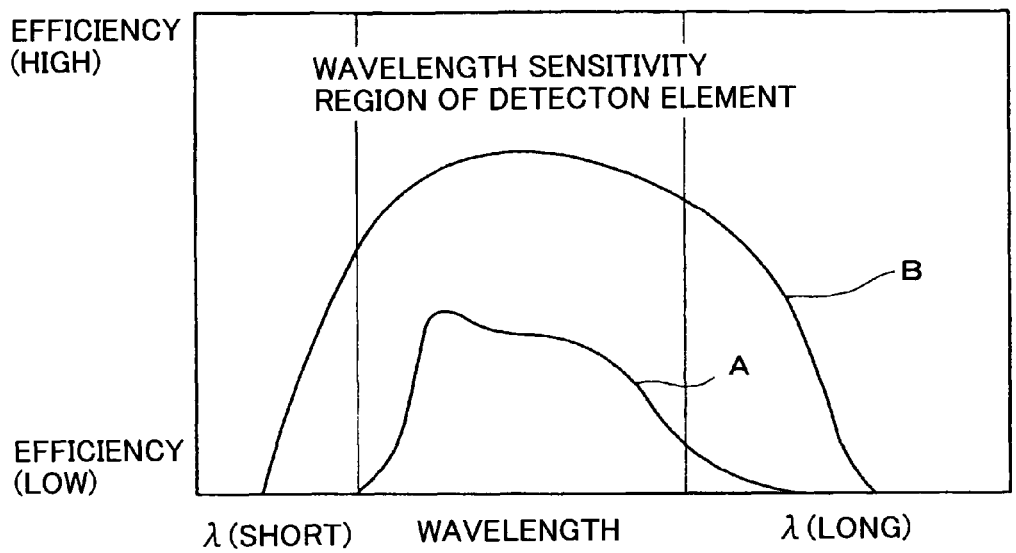
FIG. 4 (A) is a diagram to show relationship between a sensitivity region of a wavelength detecting element and wavelength band of a fluorescent light emitted from a fluorescent substance layer, and FIG. 4 (B) is a diagram to show a transmission wavelength range of a wavelength filter incorporated in the electron detector.
Figure 4B:
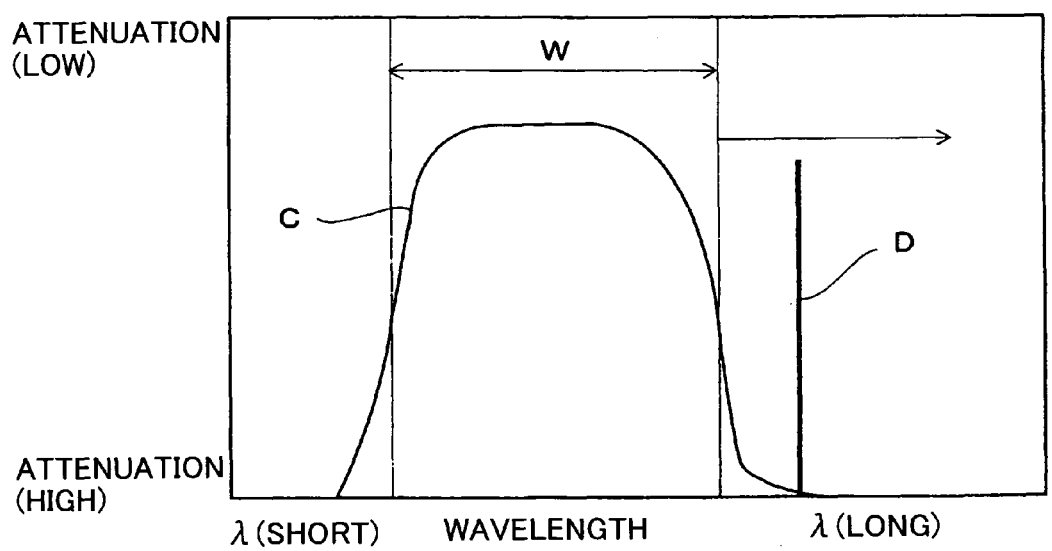

In FIG. 4 (A), a curve A shows a wavelength range of the light to be emitted from the fluorescent substance layer 32, and a curve B indicates a wavelength range of the light detected by the wavelength detecting element 36. As shown in the diagram, the wavelength range of the curve B is wider than the wavelength range of the curve A. Even when the wavelength range to reach the wavelength detecting element 36 is limited to the curve A, i.e. when it is limited to the wavelength range of the fluorescent light emitted from the fluorescent substance layer 32, there occurs neither trouble nor inconvenience in respect to the sensitivity.

In FIG. 4 (B), a curve C represents wavelength transmission characteristics of the wavelength filter 34. The wavelength filter 34 has a transmission wavelength range W. Almost all of the wavelength ranges of the fluorescent lights are included in the transmission wavelength range W, and the transmission of wavelength is almost limited to the wavelength band of the fluorescent light. For instance, the wavelength passes through a wavelength range of 300 nm to 600 nm. When transmission range of the wavelength of the fluorescent light is limited by the wavelength filter 34, it is so designed that a transmitting light amount of the fluorescent light is in the range of 90% to 95% or more.

Therefore, if it is supported that the wavelengths of the illumination light emitted from the LED 13, the single wavelength light for interference to be emitted from the light source for measurement 24, and the inspection light emitted from the light source for detecting foreign object 26, are deviated from the transmission wavelength range W, it is possible to observe the object by other illumination light while the electron beam is projected for scanning and the scanning electron image can be observed at the same time. In this case, it is preferable that transmissivity when the illumination light and the light from the light source for measurement 24 pass through the wavelength filter 34 is 0.001% or lower.

For instance, if it is assumed that the wavelength of the inspection light emitted from the light source 26 for detecting foreign object is represented by a wavelength D in FIG. 4 (B), the inspection light is intercepted by the wavelength filter 34, and the light does not reach the wavelength detecting element 36. This means that it is possible to observe the scanning electron image while detecting or observing a foreign object on the surface of the object to be measured 8 by the foreign object detecting device 25.

In case the interferometer 4 is used, there is no need to observe an image, which is acquired by the CCD for measurement 22, by visual inspection. Therefore, the selectable wavelength range is wider, and a wavelength other than the transmission wavelength range W and the wavelength D can be easily selected.

Figure 5:
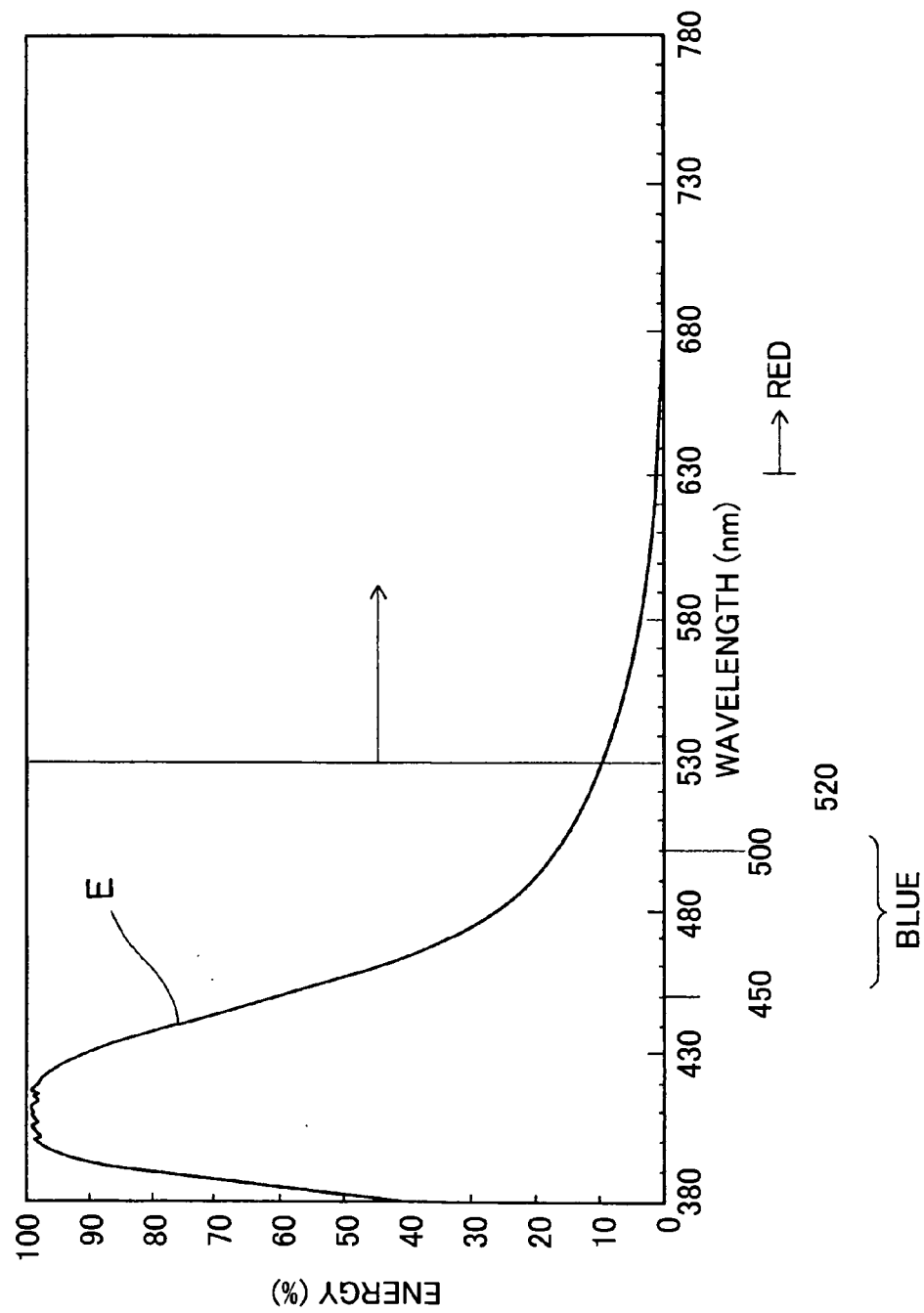
FIG. 5 is a diagram to show a wavelength range of a fluorescent light emitted when another type of fluorescent substance layer is used.

Next, FIG. 5 shows another example of the wavelength range of the fluorescent light emitted from the fluorescent substance layer 32. In the wavelength range shown by a curve E in FIG. 5, peak values of the fluorescent light are concentrated to the wavelength of 400 nm, and the spreading of the wavelength range is also narrower than the case shown by the curve A in FIG. 4 (A). It is known that a wavelength of a visible light is in the range of 380 nm to 780 nm. In the fluorescent substance layer 32, which has the curve E, almost the entire wavelength range can be covered by limiting the transmission wavelength range W of the wavelength filter 34 to the range about from 380 nm to 530 nm. By limiting the transmission wavelength range W to about the range from 380 nm to 530 nm, it is possible to use the visible light in the wavelength range from 530 nm to 780 nm, i.e. to used the visible light except the light of kind of blue color.

Further, if a part of the wavelength range from 530 nm to 780 nm is assigned to the illumination light of the optical microscope 3, and the remaining part of the wavelength range is assigned to the inspection light of the foreign object detecting device 25, the observation of the optical image by the optical microscope 3, the detection of foreign object by the foreign object detecting device 25, and the observation of the scanning electron image by the scanning electron microscope 2 can be performed at the same time. Each wavelength range as described above is given merely as example, and the present embodiment is not limited to the each wavelength range as described above.

As the LED 13, an LED may be selected, which emits a light of wavelength range as deviated from the transmission wavelength range W, or it may be so arranged that the light emitted from the LED 13 is set to a white light, and the wavelength filter 40 is provided and the LED 13 may be limited to the wavelength range out of the transmission wavelength range W.

In this case, if the wavelength filter 40 is removably disposed on the optical axis 6, and if the wavelength filter 40 is removed and is not used when the optical image is observed by the optical microscope 3 alone, a full-color optical image can be observed.

As described above, the wavelength range to be detected by the electron detector 12, the wavelength range of the illumination light of the optical microscope 3, and the wavelength range of the inspection light are separated from each other. Thus, convenience and usability of the electron microscope device 1 can be improved further.

Specifically, first, the optical image of the object to be measured 8 is observed by the optical microscope 3, and a point to be observed is specified. While observing the optical image, an inspection light is projected by the foreign object detecting device 25. By detecting the scattered light, a position to be projected is defined. Next, the electron beam is projected, and the scanning electron image at the position to be observed is observed.

A field angle of the optical system of the optical microscope 3, a field angle of the inspection light, and a field angle of the electron beam are sequentially decreased. As a result, a position to be projected by the electron beam can be easily specified. Also, the observation by the optical microscope 3 and the observation by the foreign object detecting device 25 can be carried out at the same time. As a result, the observation point can be adjusted or changed at any particular time in easy and simple manner.

The wavelength filter 34 of the electron detector 12 may be removably mounted. As a result, it is possible to use the electron microscope device 1 with the illumination light turned off if it is not necessary to perform the observation at the same time, and the observation at higher sensitivity can be carried out. This is particularly effective when it is wanted to increase S/N ratio.

When a foreign object is detected by the foreign object detecting device 25, the foreign object may be inspected to obtain physical property etc. by spectrum analysis etc. based on the information obtained by the electron detector 12.

The invention claimed is:

1. An electron microscope device, comprising a scanning electron microscope which has scanning means for scanning an electron beam and an electron detector for detecting an electron issued from a specimen where the electron beam is projected for scanning, and acquires a scanning electron image based on a detection result from said electron detector, and comprising an optical microscope for projecting an illumination light to said specimen, for receiving a reflection light from said specimen, and for acquiring an optical image, wherein said electron detector comprises an arrangement of layers, one after another, that includes a fluorescent substance layer for performing photoelectric conversion, a wavelength filter giving restriction so that all or almost all of wavelength ranges of fluorescent lights from said fluorescent substance layer can be transmitted, and a wavelength detecting element for receiving said fluorescent light transmitted through said wavelength filter and for performing photoelectric conversion, wherein said illumination light is designed to have a wavelength deviated from a transmission wavelength range of said wavelength filter, and wherein said illuminating light and said electron beam are projected at the same time, and the optical image and the scanning electron image can be acquired at the same time.

2. An electron microscope device according to claim 1, further comprising a foreign object detecting device for projecting an inspection light to a surface of said specimen and for detecting a foreign object by detecting a scattered light from the foreign object, wherein said inspection light is designed to have a wavelength deviated from the transmission wavelength range of said wavelength filter.

3. An electron microscope device according to claim 1, further comprising an interferometer for projecting an interference light to the surface of said specimen and for detecting a position in height direction of said specimen by using a reflection of said interference light from the surface of said specimen, wherein said interference light is designed to have a wavelength deviated from the transmission wavelength range of said wavelength filter.

4. An electron microscope device according to claim 1, further comprising a foreign object detecting device for projecting an inspection light to the surface of said specimen and for detecting a foreign object by detecting a scattered light from the foreign object, and an interferometer for projecting an interference light to the surface of said specimen and for detecting a position in height direction of said specimen by using the reflection of said interference light from the surface of said specimen, wherein said inspection light, and said interference light have wavelengths deviated from the transmission wavelength range of said wavelength filter, and wherein said illumination light, said inspection light, and said interference light are designed to have wavelength bands different from each other.

5. An electron microscope device according to one of claims 1 and 2 to 4, wherein said illumination light is a white light, and a wavelength filter for allowing a light of wavelength range deviated from said transmission wavelength range of said wavelength filter to transmit is removably provided on an optical path of said illumination light, and when the scanning electron image is observed by said scanning electron microscope, said wavelength filter is inserted, and observation of an optical image can also be carried out at the same time, and when said scanning electron image is not observed, said wavelength filter is removed, and the optical image can be observed separately from the observation of the scanning electron image.

6. An electron microscope device according to one of claims 1 and 2 to 4, wherein said wavelength filter is removably mounted, and said wavelength filter is restricted so that all or almost all of wavelength ranges of the fluorescent lights from said fluorescent substance layer can be transmitted.

* * * * *